US008263498B2

United States Patent
Shimizu et al.

(10) Patent No.: US 8,263,498 B2
(45) Date of Patent: Sep. 11, 2012

(54) SEMICONDUCTOR DEVICE FABRICATING METHOD, PLASMA PROCESSING SYSTEM AND STORAGE MEDIUM

(75) Inventors: Ryukichi Shimizu, Nirasaki (JP); Akihiro Kikuchi, Nirasaki (JP); Toshihiko Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 706 days.

(21) Appl. No.: 11/727,403

(22) Filed: Mar. 26, 2007

(65) Prior Publication Data
US 2008/0020585 A1    Jan. 24, 2008

Related U.S. Application Data

(60) Provisional application No. 60/792,948, filed on Apr. 19, 2006.

(30) Foreign Application Priority Data

Mar. 28, 2006    (JP) ................................. 2006-089089

(51) Int. Cl.
  *H01L 21/302*    (2006.01)
  *H01L 21/461*    (2006.01)
  *H01L 21/311*    (2006.01)
(52) U.S. Cl. ........ 438/696; 438/689; 438/700; 438/706; 438/709; 438/717
(58) Field of Classification Search .................. 438/696
See application file for complete search history.

(56) References Cited

U.S. PATENT DOCUMENTS

| 6,063,711 | A  | * | 5/2000  | Chao et al. ..................... 438/724 |
| 6,090,304 | A  | * | 7/2000  | Zhu et al. ......................... 216/79 |
| 6,331,380 | B1 | * | 12/2001 | Ye et al. ......................... 430/318 |
| 6,358,670 | B1 | * | 3/2002  | Wong et al. ................... 430/296 |

(Continued)

FOREIGN PATENT DOCUMENTS

JP    11-186230    7/1999

(Continued)

OTHER PUBLICATIONS

Pant et al, Etching of Silicon Nitride in CCl2F2, CHF3, SiF4 and SF6 Reactive Plasma: A Comparative Study, Plasma Chemistry and Plasma Processing, 1999, vol. 19 No. 4, pp. 545-563.*

(Continued)

*Primary Examiner* — Nadine G Norton
*Assistant Examiner* — Stephanie Duclair
(74) *Attorney, Agent, or Firm* — Smith, Gambrell & Russell, LLP

(57) ABSTRACT

Disclosed is a semiconductor device fabricating method. A substrate is provided thereon with: an inorganic insulating film; a first inorganic sacrifice film stacked on the inorganic insulating film and having components different from those of the inorganic insulating film; a second sacrifice film formed of an inorganic insulative film stacked on the first sacrifice film, wherein a pattern for forming grooves for wiring embedment is formed in the second sacrifice film; and an organic layer including a photoresist film, wherein a pattern for forming holes for wiring embedment is formed in the organic film. According to the present invention, the thickness of the organic layer is set to be greater than the sum of the thicknesses of etch target films, i.e., the insulating film, the first sacrifice film and the second sacrifice film; the etch target films are etched in a selectivity-less manner by using plasma generated from a mixed gas of $CF_4$ gas and $CHF_3$ gas.

12 Claims, 9 Drawing Sheets

U.S. PATENT DOCUMENTS

| | | | |
|---|---|---|---|
| 6,380,096 B2 * | 4/2002 | Hung et al. | 438/723 |
| 6,479,394 B1 * | 11/2002 | Choutov et al. | 438/714 |
| 6,583,065 B1 * | 6/2003 | Williams et al. | 438/714 |
| 6,780,782 B1 * | 8/2004 | Tsai et al. | 438/725 |
| 7,030,028 B2 | 4/2006 | Mori et al. | |
| 2003/0176058 A1 * | 9/2003 | Weidman et al. | 438/638 |
| 2004/0127016 A1 * | 7/2004 | Hoog et al. | 438/637 |
| 2005/0077628 A1 * | 4/2005 | Kumar et al. | 257/758 |
| 2005/0153538 A1 * | 7/2005 | Tsai et al. | 438/636 |

FOREIGN PATENT DOCUMENTS

| | | |
|---|---|---|
| JP | 2002-9058 | 1/2002 |
| JP | 2005-243978 | 9/2005 |
| JP | 2006-32801 | 2/2006 |

OTHER PUBLICATIONS

Japanese Office Action issued on Oct. 25, 2011 for Application No. 2006-089089 with English translation.

* cited by examiner (a)

(b)

(a)

(b)

SEMICONDUCTOR DEVICE FABRICATING METHOD, PLASMA PROCESSING SYSTEM AND STORAGE MEDIUM

CROSS-REFERENCE TO RELATED APPLICATION

This application claims the benefit of U.S. provisional application No. 60/792,948 filed on Apr. 19, 2006, the entire disclosure of which is incorporated herein by reference.

TECHNICAL FIELD

The present invention relates to a semiconductor device fabricating method including a step of etching etch target films, a plasma processing system, and a storage medium containing computer program for carrying out the method.

BACKGROUND ART

As a process for forming interconnects in a semiconductor device, there has been known a dual damascene process that forms grooves (also called "trenches") for embedding wirings of Nth level and via holes for embedding electrodes connecting the wirings of the Nth level and wirings N−1th level by a series of process steps, and embeds a wiring metal such as copper into these recesses, thereby to form the wirings and the electrodes at the same time.

With the minaturization of circuit patterns, there has been proposed a process that: employs a three-layered resist including a photomask, an SOG film (i.e., an $SiO_2$ film formed by a spin coating process) and an organic film which are stacked in that order; forms holes, corresponding to via holes, in an interlayer insulating film in which the organic film is filled; and utilizes the organic film as an etch mask to form trenches, and then removes the organic film to form recesses including the trenches and the via holes.

In the above method, a spin coating process is employed in order to form each of the photomask, the SOG film and the organic film. During formation of such a coating film by the spin coating process, a large amount of a coating liquid containing a raw material of the coating film is supplied to a rotating substrate, and a considerably large part of the supplied coating liquid is spun off due to centrifugal force and spreads around the substrate. Thus, the foregoing process is costly and the throughput thereof is low, since a large number of process steps are necessary.

In order to solve the above problem, the use of a layered structure 1 having a constitution shown in FIG. 6 is considered. In this case (the following will be described again in detail in the description of the embodiments of the invention), holes 10 are firstly formed by etching an $SiO_2$ (silicon oxide) film 14 (interlayer insulating film) via films from an antireflective film 17 to an SiN film 15 by using a resist pattern 18a formed in a photoresist (PR) film (hereinafter referred simply as "resist film") as a mask. Next, the holes 10 are extended into an underlying organic film 13; then the pattern of the $SiO_2$ film 16 is transferred to an SiN (silicon nitride) film 15; and then trenches are formed in the $SiO_2$ film 14, and concurrently, holes are formed in an SiOCH film 12 (low-k film) by using the SiN film 15 as a mask, thereby to form trenches and via holes.

The above method is advantageous in that it costs lower, and in that the number of the process steps is smaller and thus the throughput is higher, as compared with the foregoing method using three-layered resist. When performing this method, it is preferable to etch the layered films from the antireflective film 17 to the $SiO_2$ film 14 in one process step to form the holes. However, if such an etching process is performed, strongly etched areas appear in the hole locally with respect to the circumferential direction thereof, which is called "striation" (vertical steak). FIG. 7(a) shows the upper surface of the layered structure 1 after etching the $SiO_2$ film 14, and FIG. 7(b) is a cross-sectional view of a part of the layered structure 1. In these figures, 10a designates the striation. The development of striations is resulted from the fact that the etch rates of the resist film 18, the antireflective film 17, the $SiO_2$ films 14, 16 and the SiN film 15 by the etching gas converted into plasma are different from each other.

That is, as shown in FIGS. 8(a) and (b), as etching of the $SiO_2$ film 14 progresses, the films are etched so that the diameter of the hole increases in such a manner that the diameter of the hole is wider according to the proximity to the upper end of the hole. If the difference in etch rates between adjacent films is large, in other words, etch selectivity between the adjacent films exists, the hole diameter increasing rates of adjacent films are different from one another and thus a step is formed at the interface between the adjacent films. In addition, although the thickness of each film is specified by the specification of the semiconductor device, the actual film thickness is not completely uniform. As a result, the hole diameter increasing rate is different in different circumferential areas of the hole, and thus the size of the step between adjacent films is different in different circumferential areas of the hole. Accordingly, the films above the $SiO_2$ film 14 are locally etched strongly so that the shape of the holes in the films above the $SiO_2$ film 14 is distorted, and the distorted shape of the hole in the film overlying the $SiO_2$ film 14 is transferred to the $SiO_2$ film 14, whereby the striations are developed.

The lithography process is performed such that the pattern for the $SiO_2$ film 16 and the pattern for the $SiO_2$ film 14 are aligned. However, misalignment may possibly occur. If minaturization of the pattern further progresses in the future, some degree of misalignment can not be avoided. In a case where the line width of the pattern for the $SiO_2$ film 16 is close to that for the resist film 18, misalignment is likely to occur. In this case, as the pattern for the $SiO_2$ film 16 and that for the resist film 18 partially overlaps, the $SiO_2$ film 16 partially exposed at a part of the circumference of the hole when etching the antireflective film 16, as shown in FIG. 9. As a result, non-uniformity of the etch amount of the sidewall of the hole is increased, and thus the striations are more likely to be developed. The aforementioned problem should be solved to conduct the foregoing dual damascene process at a low cost.

JP2005-243978A teaches, in paragraph [0025] thereof, that a mixed gas of $CF_4$ gas and $O_2$ gas may be used for concurrently etching a resist film and an underlying $SiO_2$ interlayer insulating film at the essentially the same etch rate. However, JP2005-243978A fails to disclose or suggest a mixed gas for concurrently etching a multilayered structure including not only a resist film and an $SiO_2$ film but also inorganic sacrifice films, which is one of the remarkable features of the present invention.

SUMMARY OF THE INVENTION

The object of the present invention is to provide a semiconductor device fabricating method that is capable of preventing development of striations, when forming holes for wiring embedment by etching an etch target film composed of: an inorganic insulating film; a first inorganic sacrifice film stacked on the inorganic insulating film and having components different from those of the inorganic insulating film; a second sacrifice film formed of an inorganic insulative film stacked on the first sacrifice film, wherein a pattern for forming grooves for wiring embedment is formed in the second sacrifice film.

In a first aspect of the present invention, there is provided a semiconductor device fabricating method including the steps of: placing a substrate into a processing chamber, the substrate including: an inorganic insulating film; a first inorganic sacrifice film stacked on the inorganic insulating film and having components different from those of the inorganic insulating film; a second inorganic insulative sacrifice film stacked on the first inorganic sacrifice film, wherein a pattern for forming grooves for embedding a wiring material is formed in the second inorganic sacrifice film; and an organic layer including a photoresist film, wherein a pattern for forming holes for embedding the wiring material is formed in the organic layer, wherein a thickness of the organic layer is greater than a thickness of an etch target layer composed of the inorganic insulating film, the first sacrifice film and the second sacrifice film; supplying a mixed gas containing $CF_4$ gas and $CHF_3$ gas into the processing chamber; converting the mixed gas into plasma; and etching the etch target layer by using the plasma.

The second sacrifice film may be a silicon oxide film. In a preferred embodiment, the method further includes a step of depositing, before etching the etch target layer, a polymer layer on sidewalls of holes formed in the photoresist film, by using plasma generated by converting a mixed gas containing a CF-series gas and $CH_xF_y$ gas (x and y are natural numbers wherein their sum is four), thereby reducing opening size of the holes.

In the second aspect of the present invention, there is provided a plasma processing system that performs a plasma process to a substrate, the substrate being provided with: an inorganic insulating film; a first inorganic sacrifice film stacked on the inorganic insulating film and having components different from those of the inorganic insulating film; a second inorganic insulative sacrifice film stacked on the first inorganic sacrifice film, wherein a pattern for forming grooves for embedding a wiring material is formed in the second inorganic sacrifice film; and an organic layer including a photoresist film, wherein a pattern for forming holes for embedding the wiring material is formed in the organic layer, wherein a thickness of the organic layer is greater than a thickness of an etch target layer composed of the inorganic insulating film, the first sacrifice film and the second sacrifice film, wherein the system includes: a processing chamber provided therein with a table on which the substrate is to be placed; means for supplying a mixed gas containing $CF_4$ gas and $CHF_3$ gas for etching the etch target layer into the processing chamber; evacuating means for evacuating the processing chamber; and means for converting a gas in the processing chamber into plasma.

The system may include: means for supplying a mixed gas containing a CF-series gas and $CH_xF_y$ gas (x and y are natural numbers wherein their sum is four) into the processing chamber; and a control unit that controls the respective means such that, after the substrate is placed on the table, before etching the etch target layer, the mixed gas containing a CF-series gas and $CH_xF_y$ gas is converted into plasma, and a polymer layer is deposited on sidewalls of holes formed in the photoresist to reduce opening size of the holes.

In the foregoing system and method, a $CF_4$-$CHF_3$ flow rate ratio is preferably in a range of 0.5:1.5 to 1.5:0.5. The mixed gas may include oxygen gas. The organic layer may include an antireflective film stacked under the photoresist film, and the pattern may be formed in the photoresist film. The first sacrifice film may be a silicon nitride film.

In the third aspect of the present invention, there is provided a storage medium storing a computer program executable by a control computer of a plasma processing system, wherein, upon execution of the program, the control computer controls the processing system to make the processing apparatus perform the semiconductor device fabricating method.

BEST MODE FOR CARRYING OUT THE INVENTION

Figure 1:
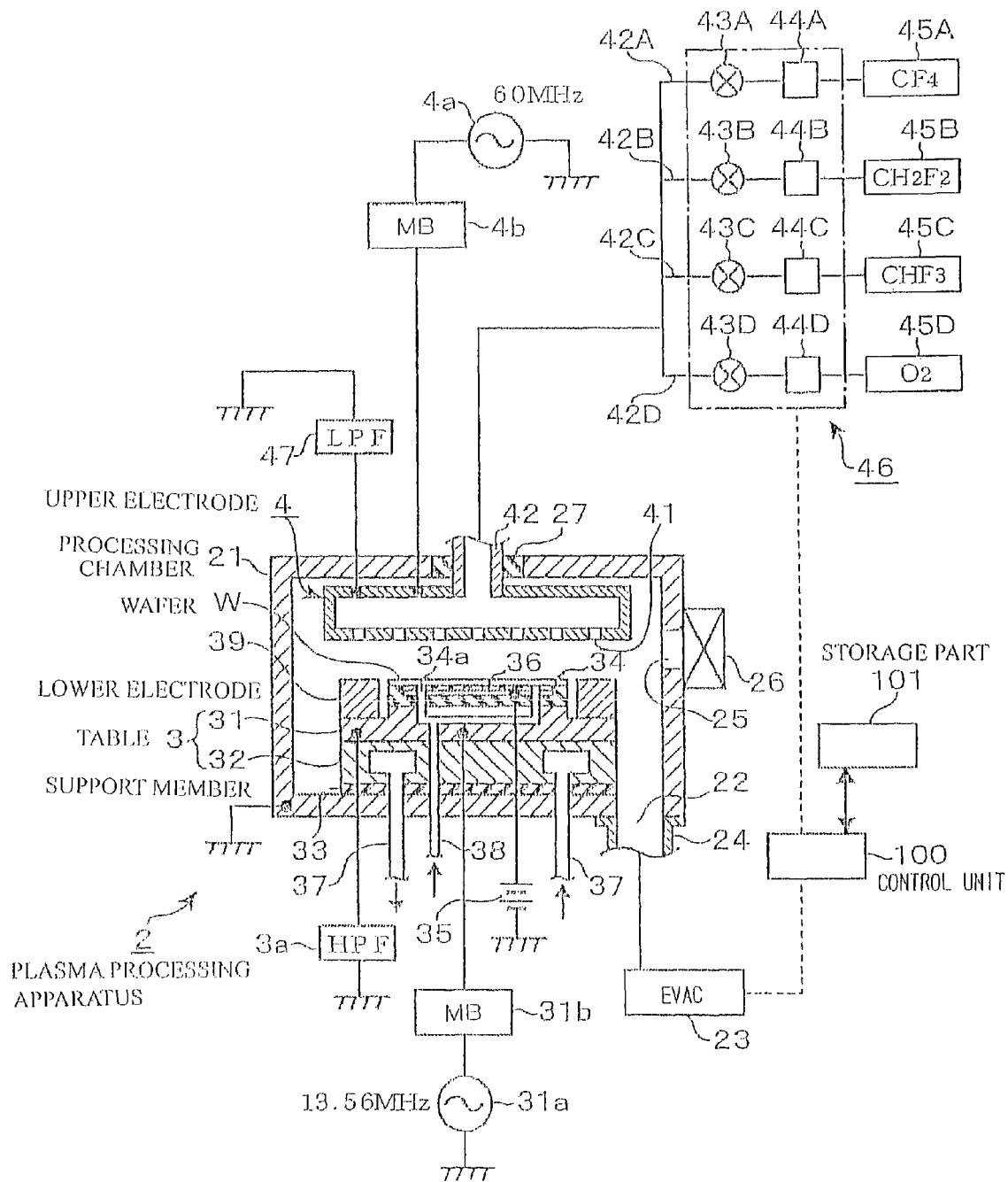
FIG. 1 is a vertical cross-sectional view schematically showing the structure of a plasma etching system in one embodiment of the present invention.

An example of a plasma processing system that may be used for a semiconductor device fabricating method according to the present invention will be described below with reference to FIG. 1. A plasma processing system 2 shown in FIG. 1 is provided with: a processing chamber 21 wherein the surfaces thereof are subjected to alumite treatment and the interior thereof is a sealed space; a table 3, or a susceptor, disposed in the processing chamber 21 on the center of the bottom of the processing chamber 21; and an upper electrode 4 disposed above the table 3 to oppose the same.

The processing chamber 21 is electrically grounded. An evacuating apparatus 23 is connected through a pipeline 24 to an exhaust port 22 formed in the bottom of the processing chamber 21. The evacuating apparatus includes a pressure adjusting unit (not shown), which receives control signals sent from a control unit 100 and evacuates the interior of the processing chamber 21, so that the interior of the processing chamber is maintained at a predetermined degree of vacuum. The control unit 100 will be described later. In FIG. 1, reference numeral 25 designates a substrate (wafer W) transfer port formed in a sidewall of the processing chamber 21. The transfer port 25 can be opened and closed by means of a gate valve 26.

The table 3 is composed of a lower electrode 31 and a support member 32 supporting the lower electrode 31 from below. The table is disposed on the bottom of the processing chamber 21 via an insulating member 33. An electrostatic chuck 34 is provided in an upper part of the table 3. The wafer W is held on the table 3 via the electrostatic chuck 34. The electrostatic chuck 34 is composed of an insulating material, and an electrode plate 36 connected to a high-voltage dc (direct current) power source 35 is provided in the electrostatic chuck 34. The dc power source 35 applies a voltage to the electrode plate 36 to generate electrostatic charge on the surface of the electrostatic chuck 34, and resultantly, the electrostatic chuck can electrostatically clamps the wafer W placed thereon. Through-holes 34 are provided in the electrostatic chuck 34 to discharge a backside gas (described later) into a space above the electrostatic chuck 34.

A cooling medium passage 37, through which a predetermined cooling medium (e.g., a fluorine-series fluid or water, which is known in the art) flows, is formed in the table 3. The cooling medium flows through the cooling medium passage 37 to cool the table 3, and thus the wafer W placed on the table 3 is cooled down to a predetermined temperature via the table 3. A temperature sensor (not shown) is attached to the lower electrode 31. The temperature of the wafer W on the lower electrode 31 is always monitored by the temperature sensor.

A gas passage 38 is formed in the table 3 to supply a heat conductive gas, such as helium (He) gas, as a backside gas. The gas passage 38 opens into the upper surface of the table 3 at plural positions. These openings are communicated with through-holes 34a provided in the electrostatic chuck 34. When the backside gas is supplied to the gas passage 38, the backside gas flows out into a space above the table 3 through the through-holes 34. The backside gas uniformly diffuses into the gap between the electrostatic chuck 34 and the wafer W placed on the electrostatic chuck 34, thereby the thermal conductivity between the wafer W and the electrostatic chuck 34 through the gap is increased.

The lower electrode 31 is electrically grounded through a highpass filter (HPF). A high-frequency power source 31a of, for example, 13.56 MHz is connected to the lower electrode 31 through a matching box 31b. A focus ring 39 is arranged on the outer periphery of the lower electrode 31 to surround the same. Plasma is focused on the wafer W on the table 31 by the focus ring 39 when generating plasma.

The upper electrode 4 is formed in a hollow shape. A number of holes 41, which are evenly distributed, are formed in the lower surface of the upper electrode 4 to constitute a gas shower head. A gas introducing pipe 42 is formed in the upper wall of the upper electrode 4, and the gas introducing pipe 42 penetrates through the center of the top wall of the processing chamber 21. The gas introducing pipe 42 is branched, at its upstream portion, into plural branch pipes. The ends of branch pipes 42A, 42B, 42C and 42D are connected respectively to a $CF_4$ (carbon tetrafluoride) gas source 45A, a $CH_2F_2$ (difluoromethane) gas source 45B, a $CHF_3$ (trifluoromethane) gas source 45C and an $O_2$ (oxygen) gas source 45D which store respective processing gases to be supplied into the processing chamber 21. In addition, the ends of other branch pipes (not shown) are connected respectively to gas sources (not shown) which store respective processing gases for performing respective steps described later.

Valves 43A, 43B, 43C and 43D and flow control units 44A, 44B, 44C and to 44D are respectively provided on the branch pipes 42A, 42B, 42C and 42D in that order toward the upstream side thereof. The not shown branch pipes are respectively provided thereon with valves and flow control units. The valves and the flow control units constitute a gas supply system 46. The gas supply system 46 controls the supply and the shutting-off of the supply of the processing gases and the flow rates of the processing gases according to control signals from the control unit 100.

The upper electrode 4 is electrically grounded through a lowpass filter (LPF) 47. A high-frequency power source 4a of a frequency higher than that of the high-frequency power source 31a, for example 60 MHz, is connected to the upper electrode 4 through a matching box 4b. The high-frequency power sources 4a and 31a are connected through the control unit 100 (these connections are not shown in the drawings), the electric power supplied from the high-frequency power sources 4a and 31a to the electrodes 4 and 31 are controlled according to the control signals sent from the control unit 100.

The foregoing plasma processing system 2 is configured so that, under the conditions where the processing chamber 21 is evacuated by means of the evacuating apparatus 23 and predetermined process gases are supplied from the respective processing gas sources 45A to 45D into the processing chamber 21 at respective flow rates, high-frequency power is applied to the upper electrode 4 and the lower electrode 31, respectively, the processing gases are converted into plasma (activated) in the processing chamber 21 by the high-frequency power applied to the upper electrode 4, and a bias potential of the wafer W is generated by the high-frequency voltage applied to the lower electrode 31 to draw ion species into the wafer W to enhance the verticality of the etch shape, whereby the wafer W placed on the table 3 is subjected to a predetermined etching process.

The plasma processing system 2 is provided with the control unit 100, which may be a computer for example. The control unit 100 is provided with a data processing part composed of component parts included in a conventional computer, such as a data storage medium (e.g., a hard disk drive, a memory device or the like), a CPU and so on. The data storage medium stores a process recipe and programs including a control programs. The process recipe specifies values of process parameters defining process conditions such as a process pressure, a process time, gas flow rates, electric powers and so on. The control program is configured so that, upon execution of the control program, the computer reads out the values of process parameter, and based on which the computer generates control signals and send them to respective functional component parts of the processing system to achieve the process conditions specified by the process recipe, so that process steps described below are performed.

The programs (including a program relating to a display for inputting process parameters) may be stored in a removable storage medium such as a flexible disk, a compact disc, a magnetooptical disc, and may be installed in the computer, or the control unit 100, via such a removable storage medium.

Figure 2:
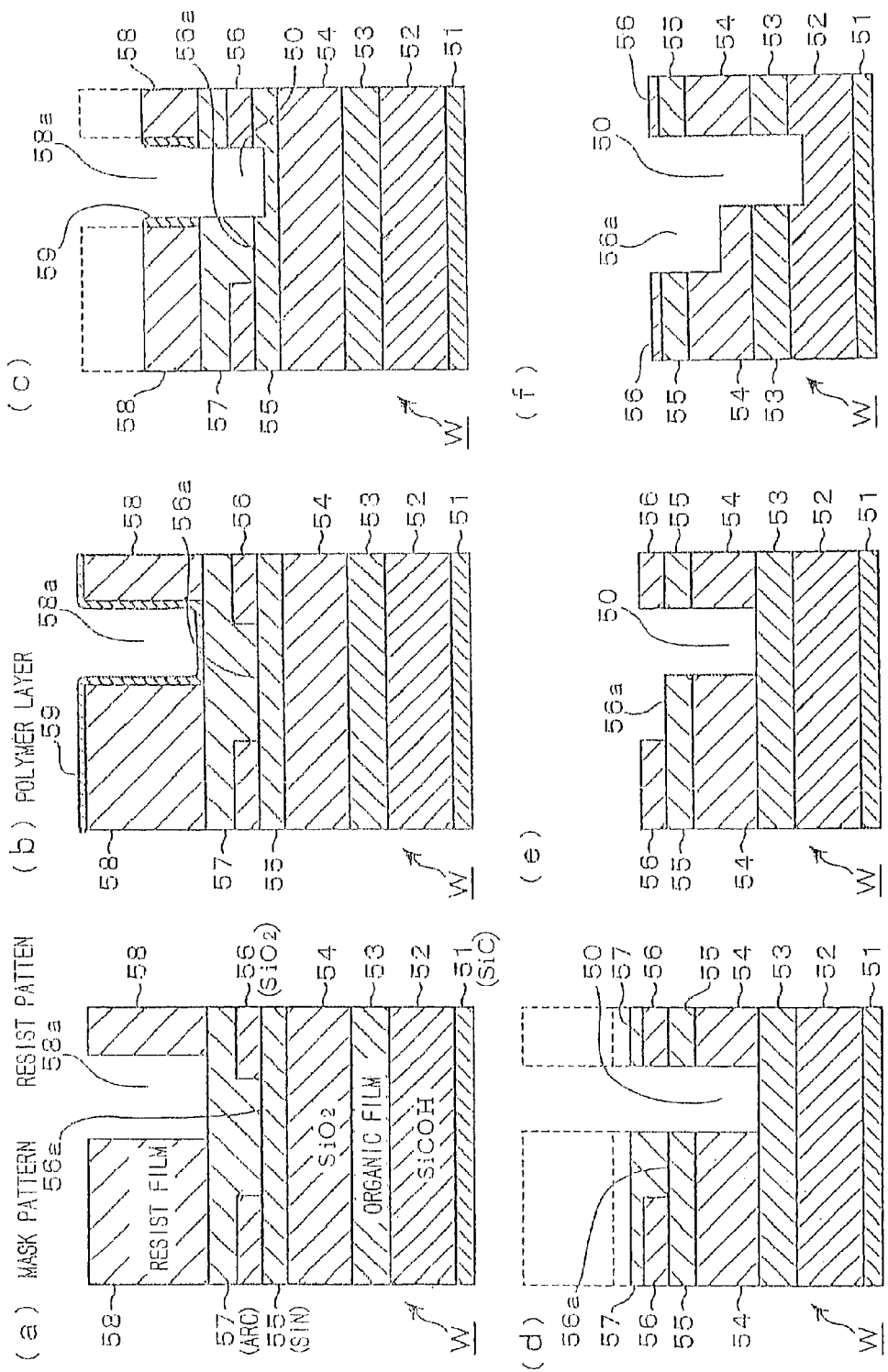
FIG. 2 shows illustrations for explaining process steps of the method in one embodiment of the present invention.
Figure 3:
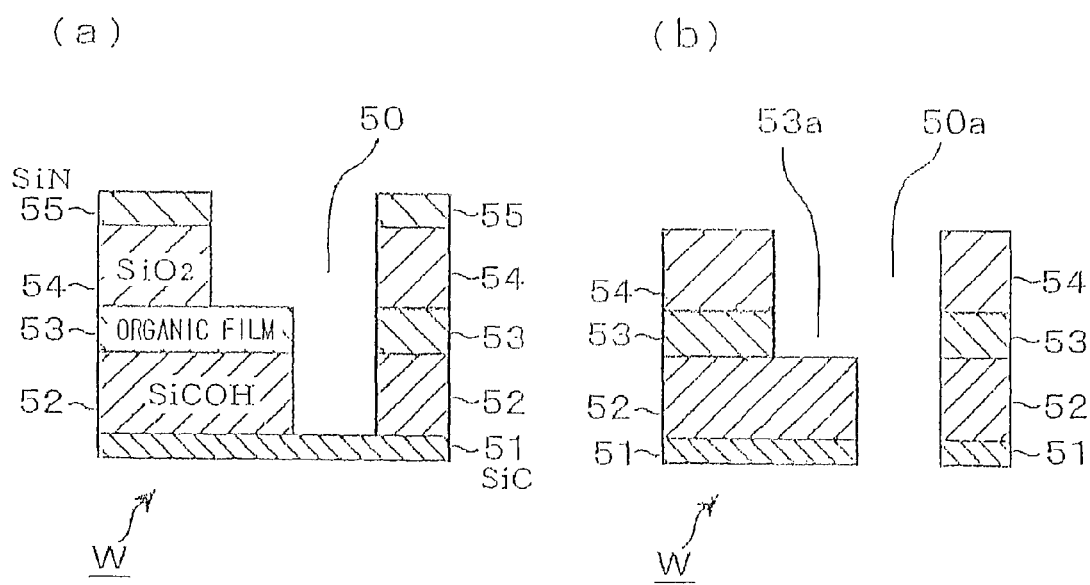
FIG. 3 shows illustrations for explaining process steps of the method in one embodiment of the present invention.

An embodiment of the semiconductor device manufacturing method according to the present invention employing the foregoing plasma processing system 2 will be described with reference to FIGS. 2 and 3. The below-described embodiment relates to a part of a dual damascene process that forms, in a wafer W having a multilayered structure, trenches (i.e., grooves) in upper layers of the wafer W and via holes connected to the trenches in lower layers of the wafer W by performing series of process steps.

First, the gate valve 26 is opened, and a wafer W (i.e., substrate) is transferred into the processing chamber 21 by means of a transfer mechanism, not shown. After the wafer W is placed horizontally on the table 3, the transfer mechanism is withdrawn from the processing chamber 21, and the gate valve 26 is closed. Subsequently, the backside gas is supplied through the gas passage 38, so that the heat conductivity between the wafer W and the electrostatic chuck 34 is increased, thereby the wafer W is cooled down to a predetermined temperature.

Thereafter, process steps of the method of the present invention will be executed. Before describing the process steps, description is made for the wafer W. The wafer W is provided, on its front-face side, with a layered structure as shown in FIG. 2(a). The layered structure includes an SiC (silicon carbide) film 51, an SiCOH film 52, an organic film 53, an $SiO_2$ film 54 which is an inorganic insulating film, an SiN film 55 which is a first sacrifice film, an $SiO_2$ film 56 which is a second sacrifice film, an antireflective film (ARC) 57 formed of an organic material, and a resist film 58, which are stacked in that order from below. In the illustrated embodiment, the $SiO_2$ film 56 is a film that is formed by using TEOS (tetraethoxysilane) as a film-forming raw material. Formed in the $SiO_2$ film 56 is a mask pattern 56a, which is used for forming trenches 53, which are grooves into which a wiring material is to be embedded. A resist pattern 58a, which may comprise circular holes, is formed in the resist film 58 formed on the antireflective film 57. The $SiO_2$ film 54 is formed through reaction of $SiH_4$ gas and $O_2$ gas. The $SiO_2$ film 54, the SiN film 55 and the $SiO_2$ film 56 are films to be etched, in other words, "etch target films" or "an etch target layer". The combination of the antireflective film 57 and the resist film 58 is referred to as "an organic layer".

The resist film 58 and the antireflective film 57 function as an etch mask when etching the $SiO_2$ film 56, the SiN film 55 and the $SiO_2$ film 54, which will be described later associated with process step 2. The sum of the film thicknesses of the resist film 58 and the antireflective film 57 is greater than the sum of the film thicknesses of the $SiO_2$ film 56, the SiN film 55 and the $SiO_2$ film 54. For example, the thicknesses of the SiC film 51, the SiCOH film 52, the organic film 53, the $SiO_2$ film 54, the SiN film 55, the $SiO_2$ film 56, the antireflective film 57, and the resist film 58 are 40 nm, 150 nm, 100 nm, 150 nm, 50 nm, 50 nm, 60 nm and 220 nm, respectively.

Next, the process steps for the semiconductor device manufacturing method according to the present invention will be described below.

Step 1: Opening Size Reduction in Resist Pattern 58a

The evacuating apparatus 23 evacuates the processing chamber 21 through the exhaust pipe 24 so that the interior of the processing chamber 21 is maintained at a predetermined pressure, e.g., 100 mTorr ($0.13 \times 10^2$ Pa); and a mixed gas (process gas) of $CF_4$ gas (which is a CF-series gas) and $CH_2F_2$ gas is supplied into the processing chamber 21. Subsequently, a high-frequency power is applied to the upper electrode 4 to convert the gas in the processing chamber 21 into plasma; and a high-frequency power is applied to the lower electrode 31 to draw the plasma thus generated into the wafer W. In Step 1, as the process gas includes the $CH_2F_2$ gas, polymer components derived from active species originated from the $CH_2F_2$ gas deposit on the surface of the resist film 58 to form a polymer layer 59, thereby the size of the openings of the resist pattern 58a is reduced (FIG. 2(a), 2(b)). The width reduction of the recesses in the resist pattern 58a is carried out in order to reduce a CD (critical dimension) of the hole(s) 50 (i.e., CD shrink) formed by the steps following Step 1.

Step 2: Formation of Holes 50 in $SiO_2$ Film 54

The high-frequency power sources 4a and 31a are turned off to stop generating plasma, and the supply of the $CF_4$ gas and $CH_2F_2$ gas into the processing chamber 21 is stopped. The evacuating apparatus 23 evacuates the gas remaining in the processing chamber 21, and thereafter, a mixed gas of $CF_4$ gas, $CHF_3$ gas and $O_2$ gas are supplied into the processing chamber. This mixed gas may deem to be a selectivity-less gas, in other words, a gas whose etch rates of the resist film 58, the antireflective film 57, the $SiO_2$ films 54 and 56 and the SiN film 55 are substantially the same. In view of the experiment results (described later), the term "selectivity-less" is considered to be such that, the ratio of each of the etch rates of the $SiO_2$ films 54, the SiN film 55 and the $SiO_2$ films 56 to the etch rate of the resist film 58 is in the range of 0.8 to 1.2.

As the above mixed gas is selectivity-less to all the films, the resist film 58, the antireflective film 57, the $SiO_2$ films 54 and 56 and the SiN film 55 are etched uniformly as if they were the same kind of film (FIGS. 2(c) and (d)). The etching process is continued until the organic film 53 is exposed. As the sum of the thicknesses of the resist film 58 and the antireflective film 57 is greater than the sum of the thicknesses of the $SiO_2$ films 54 and 56 and the SiN film 55 (which are the "etch target films"), the antireflective film 57 remains after etching. The mixed gas for the etching process may be composed only of $CF_4$ gas and $CHF_3$ gas, and may be a mixed gas obtained by adding a diluent gas to $CF_4$ gas and $CHF_3$ gas. The diluent gas may be $O_2$ gas as in the foregoing embodiment.

Step 3: Antireflective Film 57 Ashing and Organic Film 53 Etching

The following process steps are briefly described. After Step 2, $O_2$ gas is supplied into the processing chamber 21 and is converted into plasma. By using the plasma, the antireflective film 57 remaining on the $SiO_2$ film 56 and the SiN film 55 after Step 2 is ashed, and the organic film 53 is etched. The organic film 53 is etched by using the SiN film 55 as an etch mask whereby holes are formed in the organic film 53 (FIG. 2(e)).

Step 4: $SiO_2$ Film 54 Etching

Thereafter, the SiN film 55 is etched by using the $SiO_2$ film 56 as an etch mask (FIG. 2(f)). The etching of SiN film 55 may be performed by using plasma originating from a mixed gas of $CH_2F_2$ gas, Ar gas, $O_2$ gas and $CF_4$ gas.

Step 5: $SiO_2$ Film 54 and SiCOH Film 52 Etching, and $SiO_2$ Film 56 Removal Thereafter, the $SiO_2$ film 54 and the SiCOH film 52 are etched by using the SiN film 55 as an etch mask. The etching of the $SiO_2$ film 54 and the SiCOH film 52 may be performed by using plasma originating from a mixed gas of $C_5F_8$ gas, Ar gas and $O_2$ gas, and at the same time the $SiO_2$ film 56 is also etched by the plasma to be removed (FIG. 3(a)).

Step 6: SiC Film 51 Etching, SiN film 55 Removal, and Organic film 53 Etching Further, the SiN film 55 is etched to be removed; the SiC film 51 is etched to extend the holes 50 downwardly to complete via holes 50a; and the organic film 53 is etched by using the $SiO_2$ film 54 as an etch mask to complete trenches 53a. Thus, recesses (50a and 53a) for embedding a wiring material by a dual damascene process are formed (FIG. 3(b)).

In the foregoing embodiment, the layered structure, which is composed of "etch target films" comprising the $SiO_2$ films 54 and 56 and the SiN film 55 and an organic mask comprising the antireflective film 57 and the resist film 58, is etched in a "selectivity-less" manner to form the holes 50. Thus, since the antireflective film 57, the resist film 58, the $SiO_2$ films 54, 56 and the SiN film 55 are not different from each other with respect to the etching gas including $CF_4$ gas and $CHF_3$ gas, formation of steps between adjacent films can be suppressed, and resultantly, development of striations can be suppressed. By applying the foregoing method to a dual damascene process which is one of the processes for semiconductor device manufacturing, since the via holes 50a passing through interlayer insulating films, i.e., the SiCOH film 52 and the SiC film 51, can be made by extending the holes 50 downwardly, the whole dual damascene process can be performed at a lower cost and a higher throughput as compared with a process where plural films are coated in multilayer by plural coating processes.

With the foregoing wafer W, the first sacrifice film 55 is an SiN film and the second sacrifice film 56 is an $SiO_2$ film, however, they are not limited thereto. The first sacrifice layer may be formed of SiCN, SiC or TiN, for example; and the second sacrifice layer may be formed of SiOC, SiCOH, SiCONH, for example. The inorganic insulating film 54, which is one of the "etch target films" underlying the first sacrifice film, is not limited to an $SiO_2$ film, but may be SiOC, SiCOH or SiCONH, for example.

EXAMPLES

Experiment 1

Example 1-1

In Example 1-1, wafers W each having the layered structure described in connection with the foregoing embodiment were prepared. First, the wafers W were subjected to Step 1 (see the foregoing embodiment) that forms a polymer layer 59 covering a resist pattern 58*a* to reduce the size of the openings in a resist pattern 58*a*, by using a plasma processing system (2) having the essentially the same structure as described in the foregoing embodiment.
Process Conditions in Step 1
    Pressure in Processing Chamber (21): 100 mTorr ($0.13 \times 10^2$ Pa)
    Electric Power Supplied to Upper Electrode (4): 500 W
    Electric power Supplied to Lower Electrode (31): 400 W
    $CF_4$ gas Flow Rate: 150 sccm
    $CH_2F_2$ gas Flow Rate: 15 sccm
    Process Time: 40 sec.

Part of the wafers W, which had been subjected to Step 1, were subjected to Step 2 (see the foregoing embodiment) to form holes 50 in an $SiO_2$ film 54.
Process Conditions in Step 2
    $CF_4$ gas Flow Rate: 100 sccm
    $CHF_3$ gas Flow Rate: 100 sccm
    $O_2$ gas Flow Rate: 10 sccm
    Process Time: 125 sec.
Note that the pressure in the processing vessel (21), the electric power supplied to the upper electrode (4), and the electric power supplied to the lower electrode (31) were set to be the same as those in Step 1.

Figure 4:
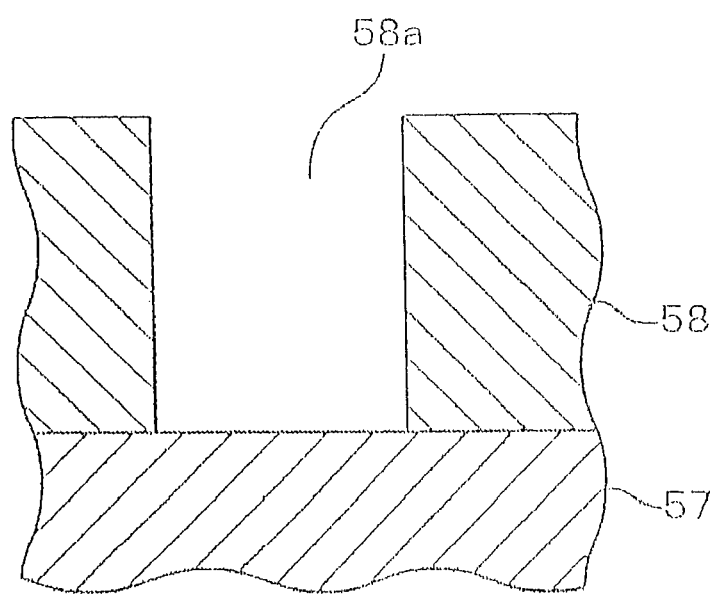
FIG. 4 shows illustrations for explaining formation of a polymer layer on a resist film.
Figure 4:
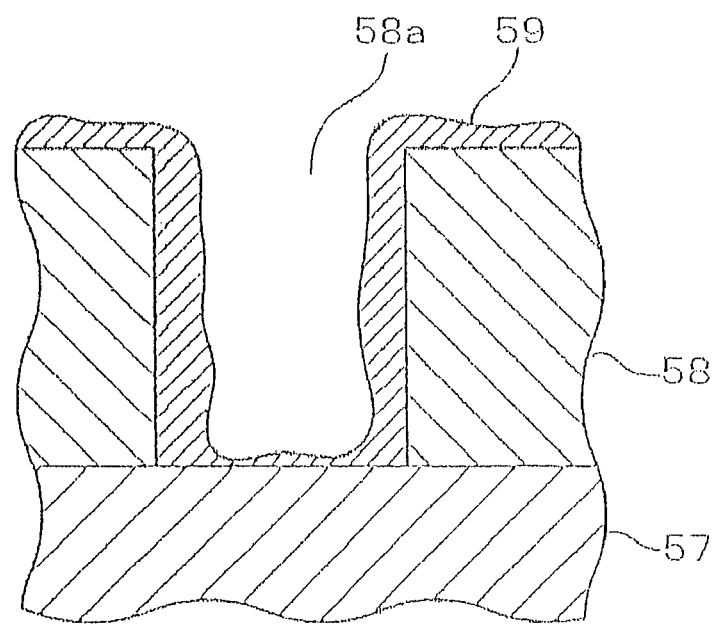

Vertically broken-out sections of non-processed wafers W and wafers W which had been subjected to Step 1 but not subjected to Step 2 were subjected to microscopic observation. The result is schematically shown in FIG. 4. It was confirmed that the size of the openings in the resist pattern 58*a* of wafer W which were subjected to Step 1 (see FIG. 4(*b*)) was reduced as compared with those in the resist pattern 58*a* in the non-processed wafer W (see FIG. 4(*a*)).

Figure 5:
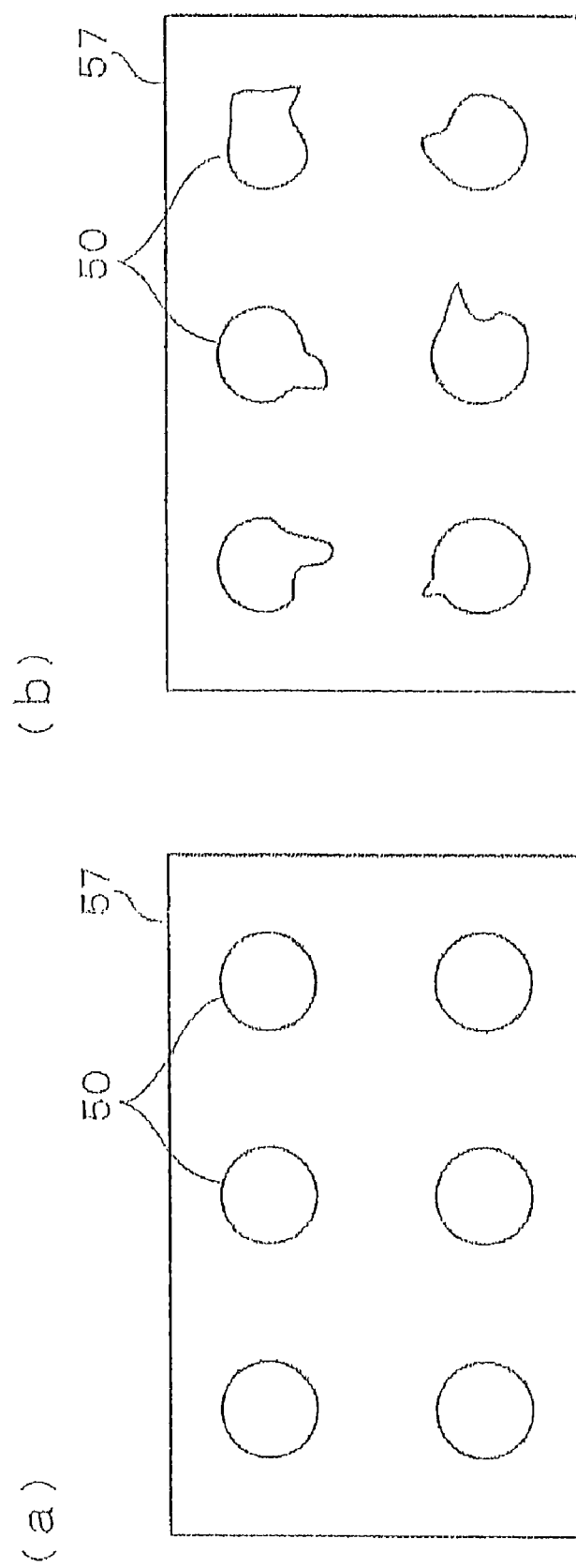
FIG. 5 shows schematic top plan views of wafers for explaining the shape of the holes.
Figure 6:
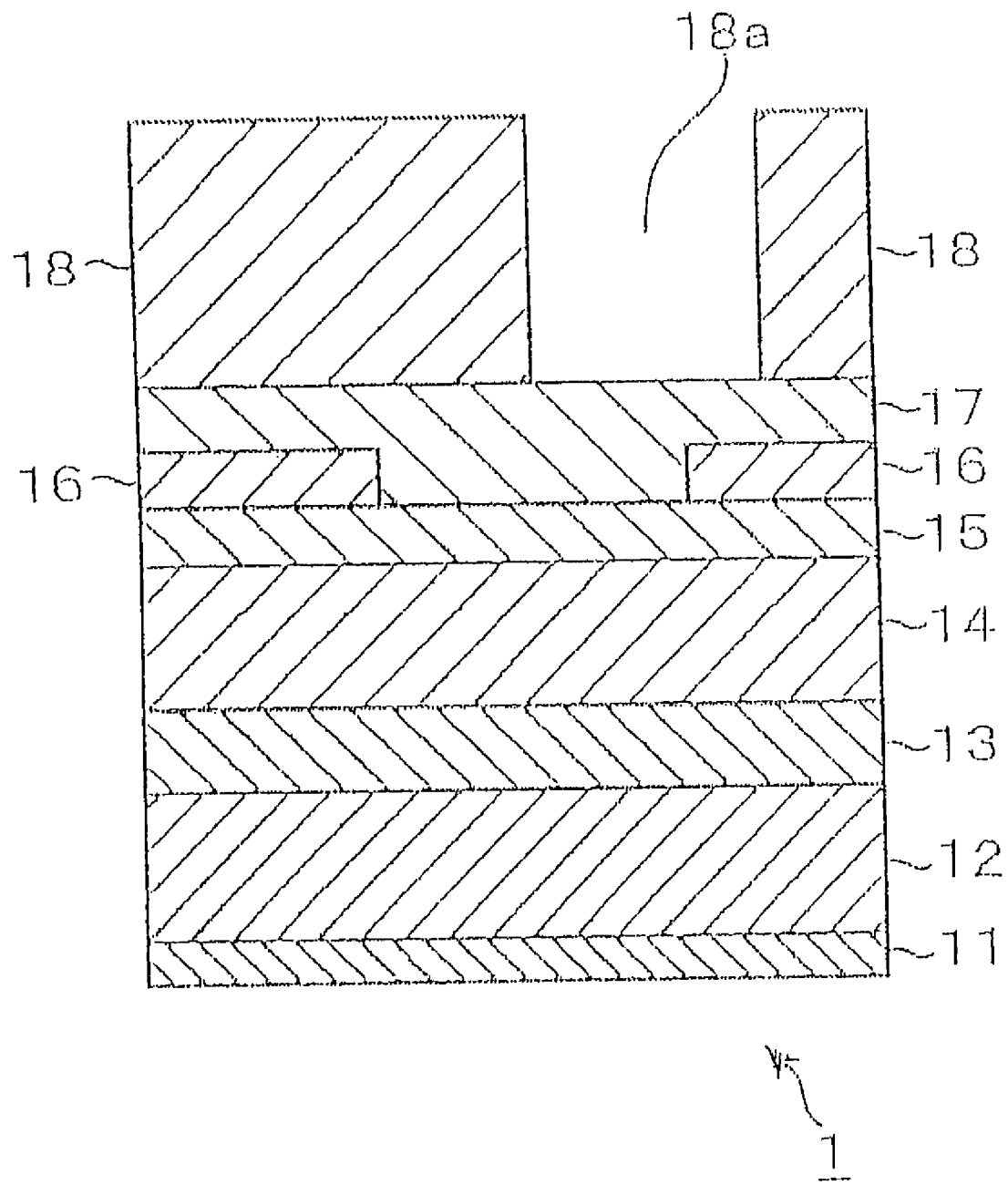
FIG. 6 is a vertical cross-sectional view showing the constitution of a layered structure including etch target films.
Figure 7:
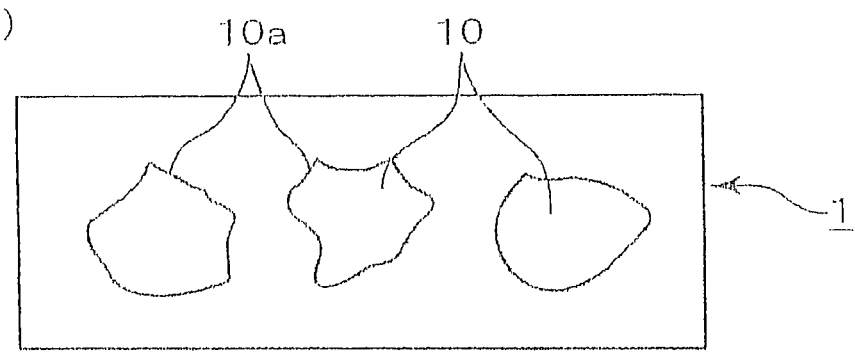
FIG. 7 shows illustrations for explaining striations developed in a hole, which is formed by etching the layered structure according to a conventional etching method.
Figure 7:
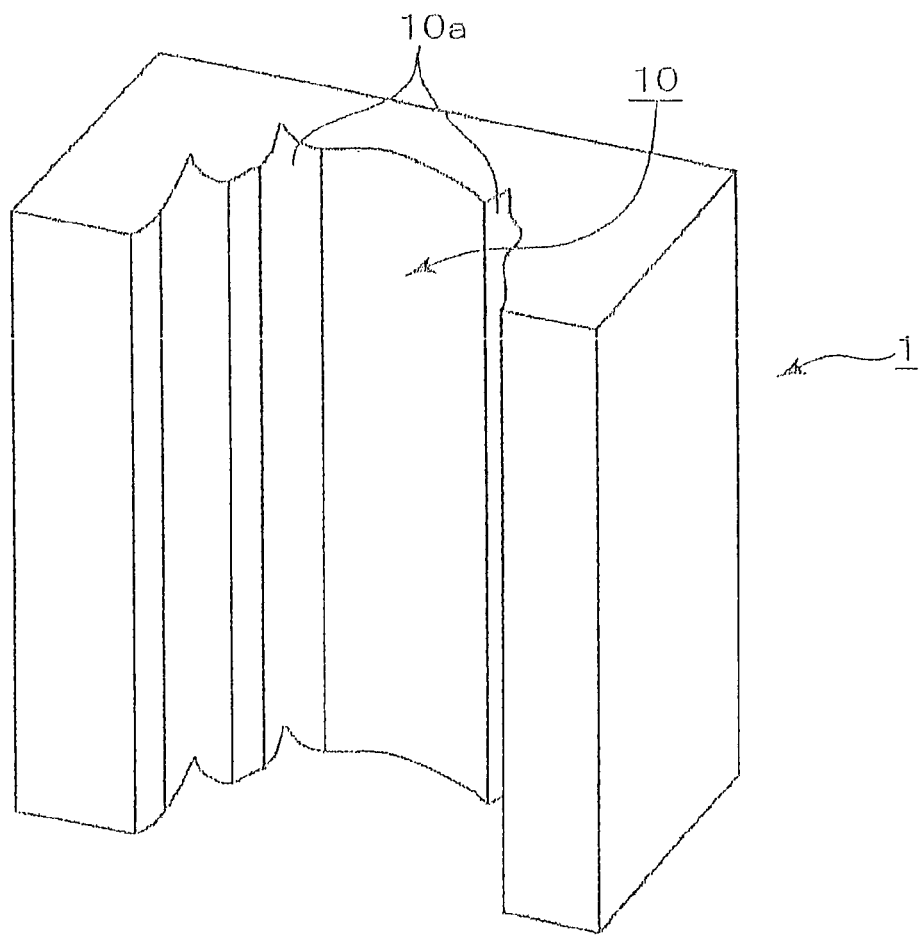
Figure 8:
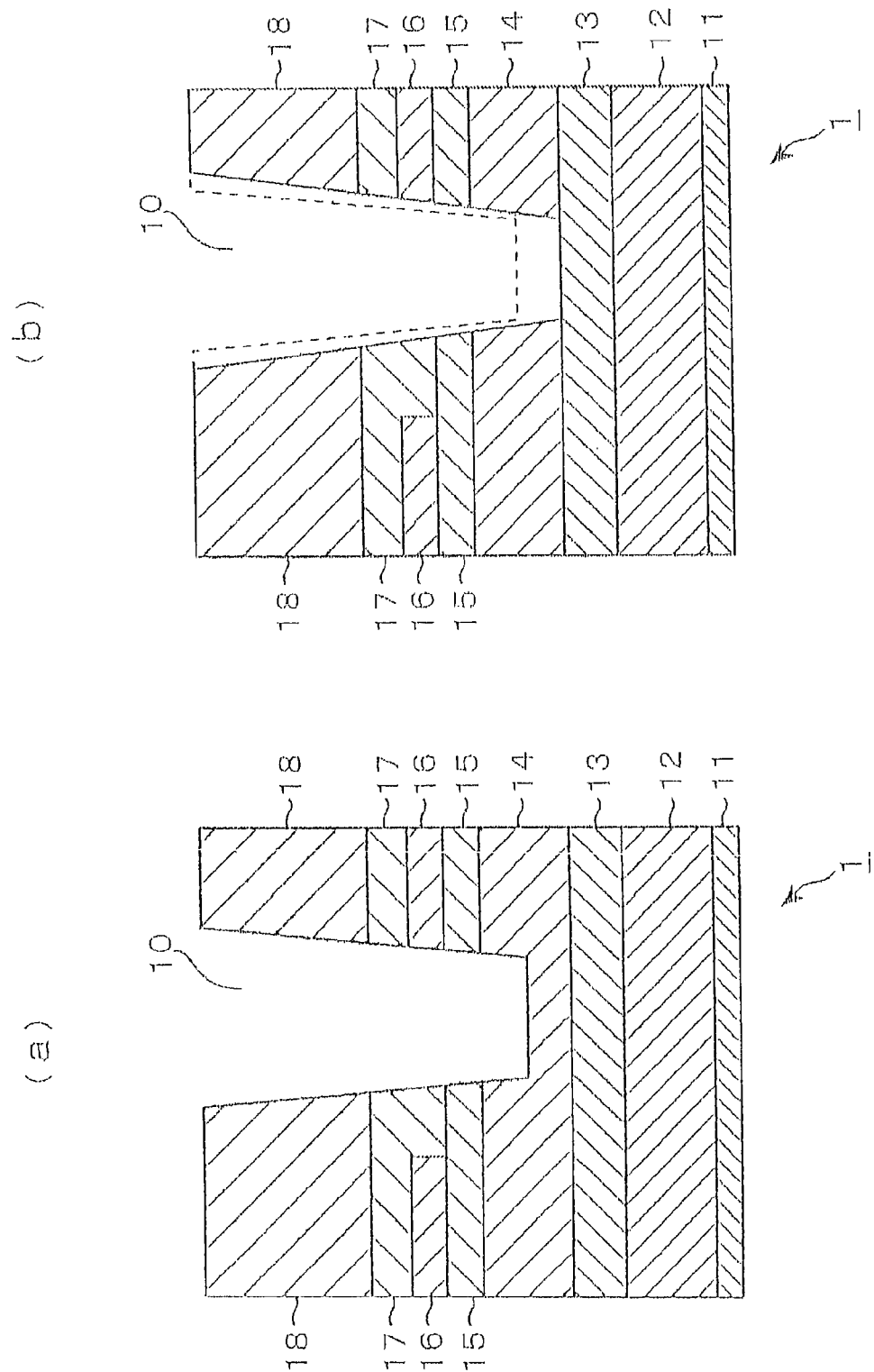
FIG. 8 shows illustrations for explaining how the layered structure is etched.
Figure 9:
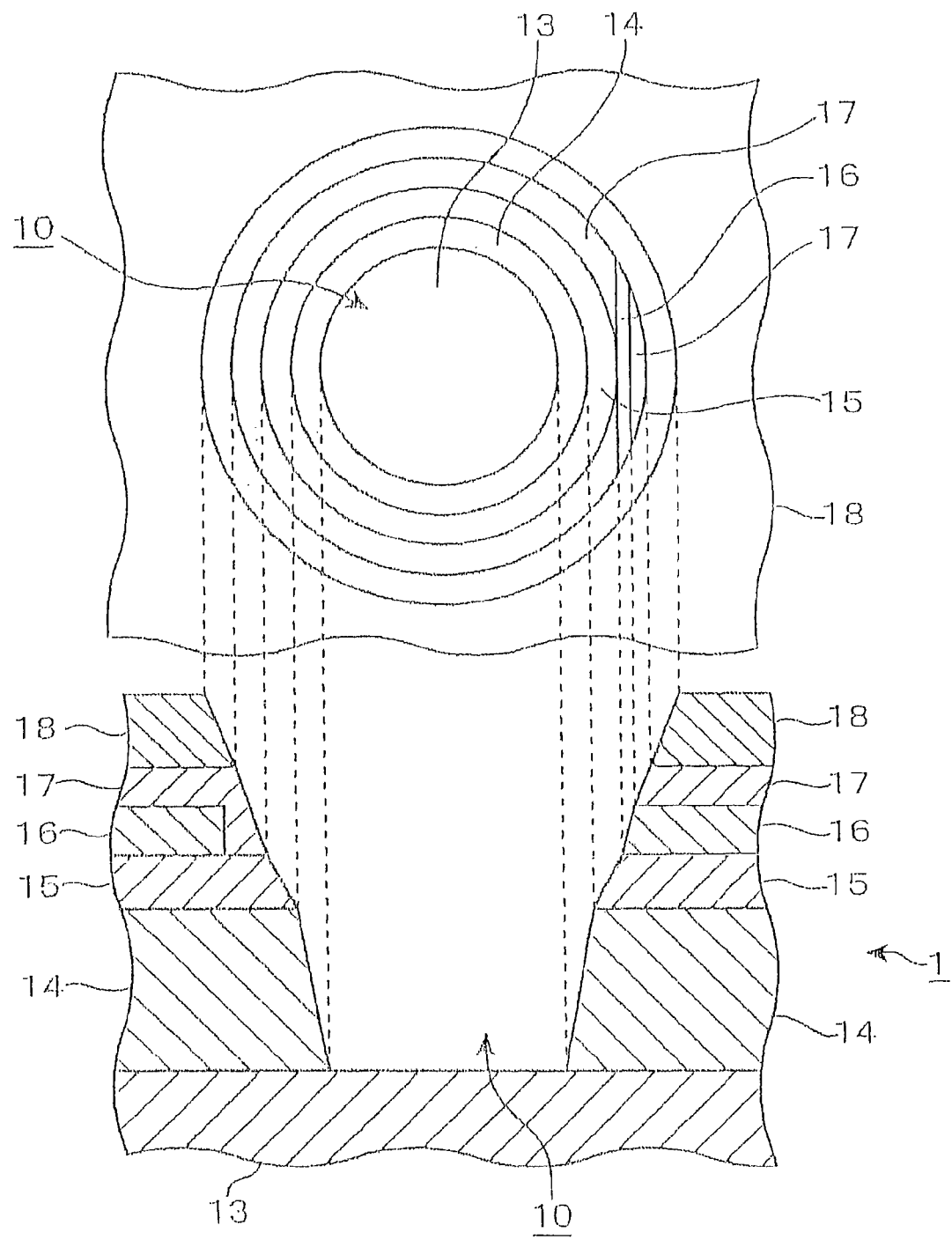
FIG. 9 is an illustration showing the constitution of the hole formed by etching the layered structure.

Next, the center portion and the peripheral portion of the upper surface of a wafer W that had been subjected to Step 2 were subjected to microscopic observation. Both the holes 50 in the center portion and the holes 50 in the peripheral portion of the wafer W were opened in a substantially circular shape, and no striations are developed in the holes 50 (see FIG. 5(*a*)). After the observation of the holes 50, part of an antireflective film 57 which had not been etched and thus was remaining on the wafer W after Step 2 were ashed to be completely removed thereby to expose the $SiO_2$ film 56, by a plasma process that uses plasma generated by converting $O_2$ gas supplied into the processing chamber (21) of the plasma processing system (2). After the ashing process, the center portion and the peripheral portion of the upper surface of the wafer W were subjected to microscopic observation, and it was found that the open ends of the holes 50 both in the center portion and the peripheral portion were have a substantially circular shape, and that no striations were developed the holes 50. Thus, it was confirmed that development of striation in the holes 50 can be prevented according to the execution of the aforementioned steps.

Experiment 2

Example 2-1

In Example 2-1, wafers W were processed in the same way as Step 1 of Example 1-1 to reduce the size of the openings in the resist pattern 58*a*. Then, as step 2A, holes 50 were formed in an $SiO_2$ film 54 under almost the same process conditions as those of Step 2 in Example 1-1. In Step 2A, $O_2$ gas was not supplied into the processing chamber (21) and thus the wafers W were processed by using a mixed gas composed only of $CF_4$ gas and $CHF_3$ gas. The process conditions in Step 2A of Example 2-1 were as shown below. Note that, in Example 2-1 and also in Comparative Example 2-1 to 2-3 and Example 3, the process conditions in Step 1 were the same as those in Step 1 of Example 1-1.
Process Conditions in Step 2A
    $CF_4$ gas Flow Rate: 150 sccm
    $CHF_3$ gas Flow Rate: 15 sccm
    Process Time: 131 sec.
The other process conditions were the same as those in Step 1 of Example 1-1. After Step 2A, holes 50 are subjected to microscopic observation in the same way as that of Example 1-1. It was found that the open ends of holes 50 are substantially circular, and no striations were developed in the holes 50.

Comparative Example 2-1

In Comparative Example 2-1, after Step 1, wafers W were subjected to an etching process under the same process conditions as those in Step 2A of Example 2-1, except that the process time was 44 sec. Thereafter, as step 3A, wafers W were subjected to an etching process by using plasma generated by converting a mixed gas composed of $C_5F_8$ gas, $CH_2F_2$ gas, Ar gas and $O_2$ gas. The process conditions of the step 3A were as shown below.
Process Conditions in Step 3A
    Pressure in Processing Chamber (21): 30 mTorr ($0.04 \times 10^2$ Pa)
    Electric Power Supplied to Upper Electrode (4): 1000 W
Electric Power Supplied to Lower Electrode (31): 2300 W
    $C_5F_8$ gas Flow Rate: 13 sccm
    $CH_2F_2$ gas Flow Rate: 10 sccm
    Ar gas Flow Rate: 400 sccm
    $O_2$ gas Flow Rate: 25 sccm
    Process Time: 30 sec.
After completion of Step 3A, holes 50 were subjected to microscopic observation in the same way as that Example 1-1, and it was found that striations were developed in the holes 50 (see FIG. 5(*b*)). Thereafter, the antireflective film 57 was removed by an ashing process. The wafers W were subjected to microscopic observation again, and it was found that striations were also developed in the holes 50.

Comparative Example 2-2

In Comparative Example 2-2, the process conditions are the same as those in Comparative Example 2-1 except that the process time in Step 2A was 73 sec., and the process time of Step 3A was 15 sec. After completion of step 3A, the holes 50 were subjected to microscopic observation, and it was found that striations were developed in the holes 50.

Comparative Example 2-3

In Comparative Example 2-3, wafers W were subjected to a process of reducing the size of the openings in the resist pattern 58 under the same process conditions as those in Step 1 of Example 1-1, and then were subjected to a process under the same process conditions as those in Step 2A except that the process time is 90 sec. Thereafter, as step 3B, etching process were performed by using plasma generated by converting a mixed gas composed of $C_5F_8$ gas, Ar gas and $O_2$ gas, supplied into the processing chamber (21), thereby holes 50 were formed in the $SiO_2$ film 54. The process conditions in step 3B were as shown below.

Process Conditions in Step 3B

Pressure in Processing Chamber (21): 50 mTorr ($0.67 \times 10^2$ Pa)

Electric Power Supplied to Upper Electrode (4): 500 W

Electric Power Supplied to Lower Electrode (31): 2500 W $C_5F_8$ gas Flow Rate: 10 sccm Ar gas Flow Rate: 1400 sccm $O_2$ gas Flow Rate: 10 sccm Process Time: 30 sec.

After completion of Step 3B, holes 50 were subjected to microscopic observed in the same way as that in Comparative Example 2-1, and it was found that striations were developed in the holes 50.

According to the experiment results in Example 2-1 and Comparative Examples 2-1 to 2-3, it was found that development of striations in the holes 50 can be prevented if the $SiO_2$ film 54 is etched by using a mixed gas containing $CF_4$ gas and $CHF_3$ gas consistently, while striations are formed if the above mixed gas is changed to another etching gas in the course of forming the holes 50. This is because the gas used in steps 3A and 3B has a high etch selectivity with respect to the films constituting the layered structure.

Experiment 3

In Experiment 3 (Examples 3-1 to 3-3), wafers W were subjected to a process which is the same as Step 1 in Example 1-1, and thereafter the wafers W were subjected to processes which is substantially the same as Step 2 in Example 1-1 under different $CF_4$ gas flow rates, $O_2$ gas flow rates and process times, respectively. In Example 3-1, the $CF_4$ gas flow rate was 150 sccm, the $O_2$ gas flow rate was 5 sccm, and the process time was 125 sec. In Example 3-2, the $CF_4$ gas flow rate was 100 sccm, the $O_2$ gas flow rate was 10 sccm, and the process time was 125 sec. In Example 3-3, the $CF_4$ gas flow rate was 50 sccm, the $O_2$ gas flow rate was 15 sccm, and the process time was 120 sec.

After completion of the respective processes, the wafers W in Examples 3-1 to 3-3 were subjected to microscopic observation in the same way as in Example 2-1, and it was found that the openings of the holes of all the wafers W were circular, and no striations were developed in the holes. Thus, it was confirmed, from Examples 3-1 to 3-3, that advantageous effects of the present invention is achieved at least if $CF_4$ gas-$CHF_3$ gas flow rate ratio is within the range of 0.5:1.5 to 1.5:0.5. Among Examples 3-1 to 3-3, the shape of the holes of Example 3-2 was best conformed to the resist pattern 58a and was most favorable.

The invention claimed is:

1. A semiconductor device fabricating method that forms a recess for embedding a wiring material of a semiconductor device, said method comprising:
    providing a substrate having thereon a SiC film, a SiCOH film, an organic film, a first $SiO_2$ film, a SiN film, a second $SiO_2$ film, an antireflection film and a patterned resist film which are stacked in layers, wherein the patterned resist film has an opening having a first opening size, and wherein a total thickness of the antireflection film and the resist film is greater than a total thickness of the first $SiO_2$ film, the SiN film and the second $SiO_2$ film;
    processing the substrate by using a plasma of a first processing gas, thereby depositing a polymer on surfaces of the resist film including interior surfaces of the opening of the resist film, and thereby narrowing the opening of the resist film from the first opening size to a second opening size;
    performing non-selective etching of the resist film, the antireflection film, the second $SiO_2$ film, the SiN film and the first $SiO_2$ film down to the organic film, by using plasma of a second processing gas, and by using the resist film having the opening having the second opening size as an etch mask, thereby forming a part of a via hole;
    ashing the antireflection film and etching the organic film while using the SiN film as a mask by using a plasma of a third processing gas;
    etching the SiN film by using a plasma of a fourth processing gas, and by using the second $SiO_2$ film as an etch mask;
    etching the first $SiO_2$ film and the SiCOH film by using a plasma of a fifth processing gas, and by using the SiN film as an etch mask; and
    etching the SiN film, the SiC film and the organic film, thereby completing formation of the via hole and a trench,
    wherein the second processing gas is a mixed gas comprising $CF_4$ gas, $CHF_3$ gas and $O_2$ gas.

2. The semiconductor device fabricating method according to claim 1, wherein the $CF_4$ gas and the $CHF_3$ gas are supplied into the processing chamber at respective flow rates, and a $CF_4$ gas-$CHF_3$ gas flow rate ratio is in a range of 0.5:1.5 to 1.5:0.5.

3. The method according to claim 1, wherein the first processing gas is a mixed gas comprising $CF_4$ gas and $CH_2F_2$ gas.

4. The method according to claim 1, wherein the third processing gas is $O_2$ gas.

5. The method according to claim 1, wherein the fourth processing gas is a mixed gas comprising $CF_4$ gas, $CH_2F_2$ gas, Ar gas and $O_2$ gas.

6. The method according to claim 1, wherein the fifth processing gas is a mixed gas comprising $C_5F_8$ gas, Ar gas and $O_2$ gas.

7. A plasma processing method comprising
    providing a substrate having thereon a SiC film, a SiCOH film, an organic film, a first $SiO_2$ film, a SiN film, a second $SiO_2$ film, an antireflection film and a patterned resist film which are stacked in layers, wherein the patterned resist film has an opening having a first opening size, and wherein a total thickness of the antireflection film and the resist film is greater than a total thickness of the first $SiO_2$ film, the SiN film and the second $SiO_2$ film;
    placing the provided substrate into a processing chamber;
    supplying a first processing gas into the processing chamber and generating a plasma of the first processing gas, thereby depositing a polymer on surfaces of the resist film including interior surfaces of the opening of the resist film, and thereby narrowing the opening of the resist film from the first opening size to a second opening size;

supplying a second processing gas into the processing chamber and generating a plasma of the second processing gas, thereby performing non-selective etching of the resist film, the antireflection film, the second $SiO_2$ film, the SiN film and the first $SiO_2$ film down to the organic film, by using the resist film having the opening having the second opening size as an etch mask, thereby forming a part of a via hole;

supplying a third processing gas into the processing chamber and generating a plasma of the third processing gas, thereby ashing the antireflection film remaining on the second $SiO_2$ film and the SiN film, and etching the organic film by using the SiN film as an etch mask;

supplying a fourth processing gas into the processing chamber and generating a plasma of the fourth processing gas, thereby etching the SiN film by using the second $SiO_2$ film as an etch mask:

supplying a fifth processing gas into the processing chamber and generating a plasma of the fifth processing gas, thereby etching the first $SiO_2$ film and the SiCOH film by using the SiN film as an etch mask; and etching the SiN film, the SiC film and the organic film, thereby completing formation of the via hole and a trench, wherein the second processing gas is a mixed gas comprising $CF_4$ gas, $CHF_3$ gas and $O_2$ gas.

8. The method according to claim 7, wherein the first processing gas is a mixed gas comprising $CF_4$ gas and $CH_2F_2$ gas.

9. The method according to claim 7, wherein the $CF_4$ gas-$CHF_3$ gas flow rate ratio is in a range of 0.5:1.5 to 1.5:0.5.

10. The method according to claim 7, wherein the third processing gas is $O_2$ gas.

11. The method according to claim 7, wherein the fourth processing gas is a mixed gas comprising $CF_4$ gas, $CH_2F_2$ gas, Ar gas and $O_2$ gas.

12. The method according to claim 7, wherein the fifth processing gas is a mixed gas comprising $C_5F_8$ gas, Ar gas and $O_2$ gas.

* * * * *